(12) United States Patent
Vilela et al.

(10) Patent No.: US 8,811,108 B2
(45) Date of Patent: Aug. 19, 2014

(54) CODE COVERAGE CIRCUITRY

(75) Inventors: Rafael M. Vilela, Campinas (BR); Walter Luis Tercariol, Campinas (BR); Fernando Zampronho Neto, Campinas (BR); Sandro A. P. Haddad, Aguas Claras (BR)

(73) Assignee: Freescale Semiconductor, Inc., Austin, TX (US)

( * ) Notice: Subject to any disclaimer, the term of this patent is extended or adjusted under 35 U.S.C. 154(b) by 495 days.

(21) Appl. No.: 13/195,505

(22) Filed: Aug. 1, 2011

(65) Prior Publication Data

US 2013/0033924 A1    Feb. 7, 2013

(51) Int. Cl.
    *G11C 11/24* (2006.01)
(52) U.S. Cl.
    USPC .................. 365/230.06; 365/230.08; 365/201
(58) Field of Classification Search
    CPC ..... G11C 16/12; G11C 11/5628; G11C 29/50
    USPC ................................. 365/230.06, 230.08, 201
    See application file for complete search history.

(56) References Cited

U.S. PATENT DOCUMENTS

| | | | | |
|---|---|---|---|---|
| 5,357,480 A | * | 10/1994 | Vinal | 365/233.5 |
| 5,363,001 A | * | 11/1994 | Vinal | 365/189.05 |
| 5,424,980 A | * | 6/1995 | Vinal | 365/189.15 |
| 6,473,345 B2 | * | 10/2002 | Hayasaka et al. | 365/191 |
| 7,254,071 B2 | * | 8/2007 | Tu et al. | 365/201 |
| 7,617,416 B2 | | 11/2009 | Gupta et al. | |
| 8,625,361 B2 | * | 1/2014 | Chiu et al. | 365/189.04 |
| 2005/0028146 A1 | | 2/2005 | Quick | |
| 2007/0159888 A1 | * | 7/2007 | Tu et al. | 365/185.21 |
| 2008/0002468 A1 | * | 1/2008 | Hemink | 365/185.17 |

OTHER PUBLICATIONS

Rajagopal Vijayaraghavan, et al., "Design for MOSIS Educational Program (Research)", EE Department, University of Tennessee, Knoxville, http://www-ece.engr.utk.edu/Analog_Counter_Report.pdf.

* cited by examiner

*Primary Examiner* — Tuan T Nguyen

(57) ABSTRACT

A circuit includes a memory (130) coupled to an analog line coverage circuit (104). The analog line coverage circuit includes a plurality of buffers (151-154) in which each buffer is coupled to one memory location of the memory, a plurality of bin cells (161-164) in which each bin cell is coupled to a buffer, a multiplexer (170), each input terminal of which is coupled to a bin cell, and an analog-to-digital converter (180) coupled to the multiplexer and to an output terminal of the analog line coverage circuit. The analog line coverage circuit stores an analog voltage that is representative of a number of occasions that a memory location is accessed, and outputs a signal indicative thereof. A processor (102) is coupled to the memory and to the analog line coverage circuit, and the processor enables the analog line coverage circuit when the processor is in a debug mode.

18 Claims, 4 Drawing Sheets

CODE COVERAGE CIRCUITRY

BACKGROUND

1. Field

This invention relates generally to data processing, and more specifically to code coverage software testing.

2. Related Art

Code coverage is a measure of how well a software program is tested. One form of code coverage is statement, or line, coverage, which determines how many times, if any, each program memory location was accessed during testing. Code coverage can also identify which lines of code, if any, were not accessed during testing. Known testing methods for line coverage are expensive, complex or/and require a large amount of user, or human, interaction.

Some known methods of testing for line coverage provide a specific "bank" to retain the statistical data obtained from the testing. Such a bank disadvantageously uses memory.

Another known method of testing for line coverage uses instruments connected to selected locations within a processor during the execution of code on the processor such that each selected locations becomes an individual test checkpoint. Then, this known method generates a signature using the test check-points. This known method also needs additional external equipment such as an oscilloscope and a digital counter coupled to such instruments, and needs software to control such instruments and the additional external equipment, thereby increasing cost and complexity of this known method.

Known apparatus and methods are particularly disadvantageous for testing a low-cost microcontroller used in an embedded system and/or for testing a quick time-to-market microcontroller.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
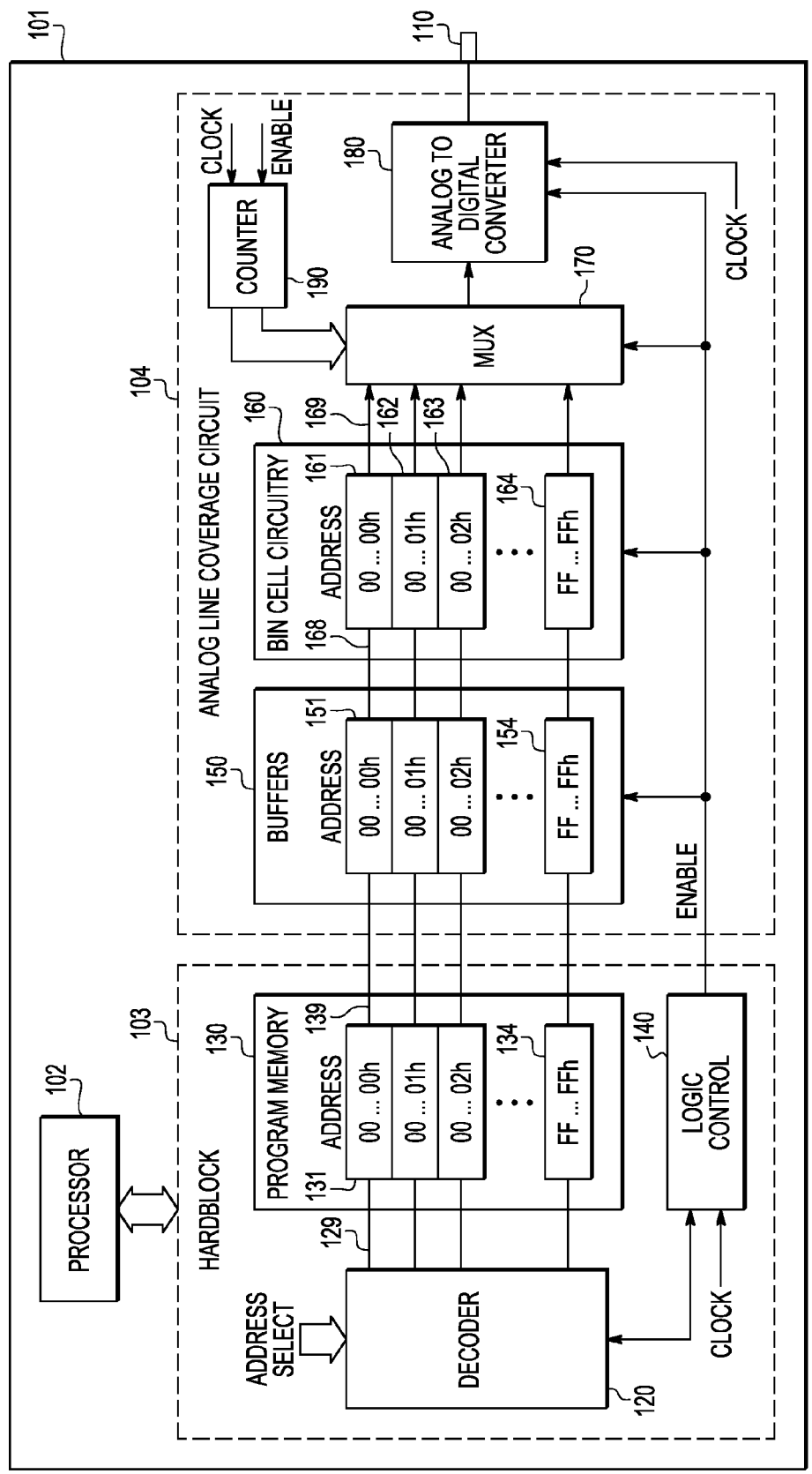
FIG. 1 is a simplified functional block diagram of a microcontroller that includes an analog line coverage circuit in accordance with the invention.

FIG. 1 is a simplified functional block diagram of a portion of a computer. In one embodiment, the computer is a microprocessor, or a microcontroller, 100 disposed on an integrated circuit 101. In one embodiment, the microcontroller 100 is part of an embedded computer system. The microcontroller 100 comprises a processor 102, a hardblock 103 which is a part of the microcontroller that is unchanged by integrated circuit design software, and an analog line coverage circuit 104 in accordance with the invention. The integrated circuit 101 includes a plurality of input/output pins, including pin 110. The hardblock 103 includes a decoder 120, a program memory 130 and a logic control 140. The program memory 130 holds software, or firmware, of the microcontroller 100. The firmware comprises a plurality of instructions. The program memory 130 comprises a plurality of M program memory locations. Each program memory location has an address. Each program memory location usually holds one instruction (in assembler language) of firmware.

FIG. 1 illustrates four (4) representative program memory locations 131-134 in the program memory 130 and their addresses in hexadecimal form, e.g., "00 . . . 02h". In one embodiment, the program memory 130 comprises flash memory configured as a matrix of word lines and bit columns. In one embodiment, one bank of the flash memory of the program memory 130 comprises five hundred twelve (512) word lines. In one embodiment of an 8-bit microcontroller, the program memory 130 comprises thirty-two (32) bit columns. In one embodiment of a 32-bit microcontroller, the program memory 130 comprises one hundred twenty-eight (128) bit columns. An internal logic control (not shown) manages locations in the flash memory to avoid an aging effect. The managing is accomplished by layout architecture and a state machine to homogenize the use of the flash memory. In one embodiment, the program memory 130 comprises embedded flash memory of NOR architecture. In other embodiments, the program memory 130 may comprise random access memory, read-only memory, or other types of memory.

The decoder 120 is coupled to an address select bus and to the program memory 130. The address select bus has a sufficiently sized width so as to be able select all the word lines in the program memory 130. In one embodiment, the address bus is eight (8) bits wide. The address select bus transfers to the decoder 120 information related to a region of the program memory 130 that may be selected by the microcontroller 100. In one embodiment, the region is a specific word line (see FIG. 2). The decoder 120 processes the information contained on the address bus and selects a word line of memory based on such information. The decoder 120 is coupled to the program memory 130 by a plurality of address selection lines, such as address selection line 129. In one embodiment, the decoder 120 is coupled to the program memory 130 by five hundred twelve (512) address selection lines. The decoder 120 then selects one of the address selection lines, based on the memory address. The hardblock 103 includes another decoder (not shown) used for bit line selection.

The logic control 140 communicates with the decoder 120. The logic control 140 comprises asynchronous logic for receiving a DEBUG signal from the decoder 120. The DEBUG signal is activated by a specific address selected by the microcontroller 100 through a user command. This specific address is a reserved address used for enabling/disabling the analog line coverage circuitry 104. The DEBUG signal is enabled when a user wants to enter a debug mode. The logic control 140 receives a CLOCK signal and outputs an ENABLE signal to the analog line coverage circuit 104. In one embodiment, the CLOCK signal has a frequency in a range of tens of megahertz (in one embodiment, 20-80 MHz). The logic control 140 enables a sequence of READ events to be registered in the bin cell circuitry 160 and exported outside the integrated circuit 101 for checking by a user so that firmware code may be optimized. When the analog line coverage circuit 104 is not enabled, the ENABLE signal is at a first value. In one embodiment, the first value is logical "0", or at a voltage of $V_{SS}$. In one embodiment, $V_{SS}=0V$. When the analog line coverage circuit 104 is enabled, the ENABLE signal is at a second value. In one embodiment, the second value is logical "1", or at a voltage of logic $V_{DD}$. In one embodiment, $V_{DD}$=3.3V. In such one embodiment, logic $V_{DD}$=1.8V. For simplicity of illustration, a power supply is not shown in FIG. 1; however, it should be understood that there are connections between a power supply and the functional blocks of FIG. 1.

The ENABLE signal is only active during the debug mode. The debug mode is used for checking whether the firmware code is well written. In normal operation of the microcontroller 100, the analog line coverage circuit 104 is disabled. If a user wants to debug the firmware code, the analog line coverage circuit 104 is enabled and the firmware is run in the debug mode. After the results are analyzed, the analog line coverage circuit 104 is disabled, and then, if needed, the code can be re-written.

The analog line coverage circuit 104 helps to determine statement, or line, coverage, which includes determining how many times each location in the program memory 130 is accessed during testing of the firmware of the microcontroller 100. The analog line coverage circuit 104 determines how many times a program count pointer passes through a specific part of the firmware code. A digital output signal of the analog line coverage circuit 104 represents a number of times that the program count pointer passes through a specific part of the firmware code. The digital output signal of the analog line coverage circuit 104 is available at pin 110 of the integrated circuit 101.

The analog line coverage circuit 104 includes a plurality of M buffers 150, bin cell circuitry 160, a multiplexer 170, a digital-to-analog converter 180, and a counter 190. In one embodiment, the plurality of buffers 150 and the bin cell circuitry 160 are enabled by circuitry in the logic control 140. In one embodiment, each buffer of the plurality of buffers 150 is identical to the other buffers. FIG. 1 illustrates four (4) buffers 151-154 of the plurality of buffers 150. FIG. 1 illustrates four (4) bin cells 161-164 of the bin cell circuitry 160.

Each program memory address location 131-134 of the program memory 130 is coupled to one buffer 151-154 of the plurality of buffers 150 via an individual line, such as line 139. Each buffer 151-154 of the plurality of buffers 150 is coupled to one bin cell of the bin cell circuitry 160 via an individual line such as line 168.

The counter 190 has an input terminal for accepting a CLOCK signal for controlling a switching rate of the multiplexer 170 and an input terminal for accepting the ENABLE signal. The counter 190 outputs a signal to the multiplexer 170 via a bus. In an embodiment in which the program memory 130 comprises five hundred twelve (512) word lines, the bus between the counter 190 and the multiplexer 170 is nine (9) bits wide.

The multiplexer 170 includes a plurality of input terminals that are coupled to the bin cell circuitry 160, an input terminal for receiving the ENABLE signal, an input bus for receiving the signal from the counter 190, and an output terminal coupled to the A/D converter 180. Each bin cell 161-164 is coupled to one of the input terminals of the multiplexer 170 via an individual line, such as line 169. The multiplexer 170 outputs an analog signal from each of the bin cells 161-164 of the bin cell circuitry 160 to the A/D converter 180. The multiplexer 170 receives, from the bin cell circuitry 160, an analog voltage at each of its input terminals. Each such analog voltage corresponds to a different program memory address. The magnitude of each such analog voltage is representative of a number of occasions that the corresponding program memory address is accessed by the microcontroller 100 during one run of a particular firmware code. In one embodiment, the magnitude of each such analog voltage is proportional to a number of occasions that the corresponding program memory address is accessed by the microcontroller 100 during one run of a particular firmware code. The multiplexer 170 selects, based on the signal outputted by the counter 190, one input terminal of its plurality of input terminals and sequentially switches the analog voltage present on such one input terminal to its output terminal.

The A/D converter 180 changes the analog signal outputted by the multiplexer 170 to a digital signal, and outputs such digital signal. An output terminal of the A/D converter 180 is coupled to a pin 110 of the integrated circuit 101. A resolution of the A/D converter 180 is set to meet a need of a user. In one embodiment, the resolution is high enough such that the A/D converter 180 can discern each step of increase in $V_x$, i.e., the resolution is high enough such that the analog line coverage circuit 104 can count each occurrence that a program address is accessed by the firmware. In another embodiment, the resolution is lower, and the A/D converter 180 can discern only multiple steps of increase in $V_x$, i.e., the resolution is at a level such that the analog line coverage circuit 104 can only determine that the number of occurrences that a program address is accessed by the firmware lies somewhere within a range of occurrences. In yet another embodiment (not shown), the resolution of the A/D converter 180 is adjustable to meet varying needs of a user.

Figure 2:
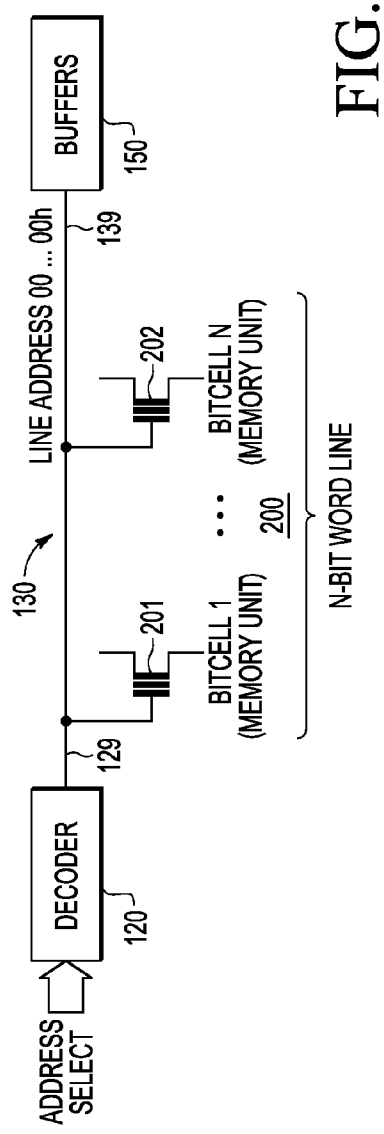
FIG. 2 is a simplified schematic of one region of a program memory.

FIG. 2 is a simplified schematic of one region the program memory 130. The one region is sized to hold at least one word. The one region is an N-bit word line 200 that comprises a plurality of bitcells including a bitcell "1" 201 and a bitcell "N" 202. Each N-bit word line 200 corresponds to one address. Each N-bit word line 200 is individually connected to the decoder 120 via separate line, such as line 129. The signal on line 129 can assume different values. To read the bit cells, the voltage on line 129 is $V_{READ}$. In one embodiment, $V_{READ}$=4.2V. To program the bit cells, the voltage on line 129 is, in one embodiment, 8.5V. To erase the bit cells, the voltage on line 129 is, in one embodiment, −8.5V. To perform no operation on the bit cells, the voltage on line 129 is, in one embodiment, 0V. Each N-bit word line 200 is individually connected to a different buffer of the plurality of buffers 150 via separate line, such as line 139. The N-bit word line 200 comprises one bitcell for each stored bit. Each bitcell may have a value of "0" or "1", thereby forming a word. The decoder 120 directs address selection to a specific word line. When a specific word line is accessed for a READ operation, the specific word line (and therefore a gate of each bitcell of the specific word line) is energized with a voltage of $V_{READ}$. The $V_{READ}$ voltage enables all the bin cells associated with the specific word line. The voltage $V_{READ}$ on each word line 200 is also used as an input signal of each buffer 151-154 of the plurality of buffers 150. More than one word can be stored on the N-bit word line 200. In one embodiment, the N-bit word line 200 is a 32-bit word line, and it may hold four 8-bit words. In another embodiment, the N-bit word line 200 is a 128-bit word line, and it may hold eight 16-bit words.

Figure 3:
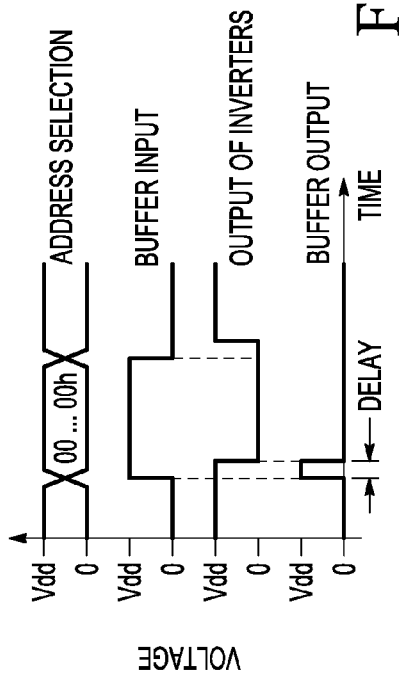
FIG. 3 is a timing diagram illustrating signals present in the analog line coverage circuit.

FIG. 3 is a timing diagram illustrating some of the signals that are present in the analog line coverage circuit 104. FIG. 3 shows an ADDRESS SELECTION signal that appears on the ADDRESS SELECT bus. FIG. 3 shows a BUFFER INPUT pulse which appears on line 139 and which is inputted into buffer 151. The BUFFER INPUT pulse has a duration of a READ event of the microcontroller 100. In one embodiment, the duration of the BUFFER INPUT pulse is 10-60 ns. FIG. 3 shows a BUFFER OUTPUT pulse which is outputted by buffer 151 and which appears on line 168. Each buffer, such as buffer 151, of the plurality of buffers 150 outputs the BUFFER OUTPUT pulse shown in FIG. 3 when a corresponding memory address location, such as memory address location 131, is accessed by the microcontroller 100. The analog line coverage circuit 104 is designed so that the width, or duration, of the BUFFER OUTPUT pulse is less than the duration of the READ event of the microcontroller 100. In one embodiment, a target duration of the BUFFER OUTPUT pulse is about one-tenth the duration of the READ event of the microcontroller 100. Therefore, if the clock frequency is 62.5 MHz and the duration of the READ event of the microcontroller 100 is 16 ns, then the target duration of the BUFFER OUTPUT pulse is 1.6 ns. The analog line coverage circuit 104 functions properly when the duration of the BUFFER OUTPUT pulse is longer than the target duration, provided that, the duration of the BUFFER OUTPUT pulse is less than the duration of the READ event of the microcontroller 100. An advantage of a shorter, rather than longer, duration of the BUFFER OUTPUT pulse is that a current consumption of the analog line coverage circuit 104 is minimized because transistors, such as NMOS transistor 507 (see FIG. 5), in the bin cells 161-164 conduct only when the pulse is high. Another advantage of a shorter, rather than longer, duration of the BUFFER OUTPUT pulse is that an area occupied by the analog line coverage circuit 104 is reduced because capacitors, such as capacitor 509 (see FIG. 5), in the bin cells 161-164 can be smaller.

Figure 4:
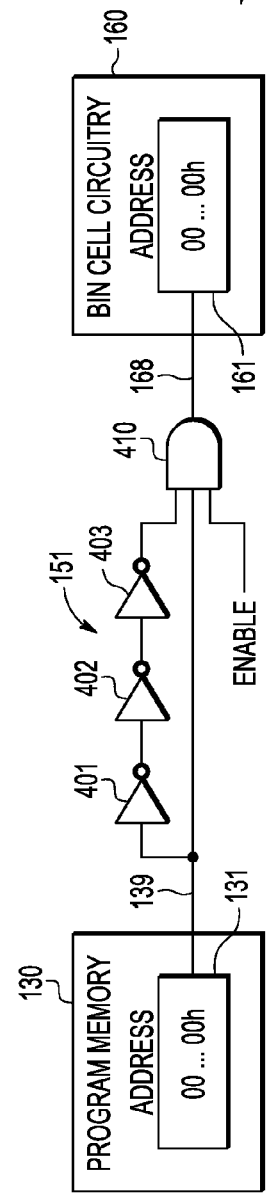
FIG. 4 is a schematic of a buffer within the analog line coverage circuit.

FIG. 4 is a schematic of one embodiment of one buffer 151 of the plurality of buffers 150. A circuit design of the buffer 151 defines the duration of the BUFFER OUTPUT pulse. The embodiment of the buffer 151 illustrated in FIG. 4 includes three (3) inverters 401-403 arranged in series. An input of the first inverter 401 is coupled to one of the lines between the decoder 120 and the buffers 150, such as line 139. An input signal of the first inverter 401 is the voltage on such line. An output of the first inverter 401 is coupled to an input of a second inverter 402. An output of the second inverter 402 is coupled to an input of a third inverter 403. An output of the third inverter 403 is coupled to a first input of a three-input AND gate 410. A second input of the AND gate 410 is coupled to the one such line (e.g., line 139) between the decoder 120 and the buffers 150. A third input of the AND gate 410 is coupled to the line that carries the ENABLE signal from the logic control 140.

Referring now to FIGS. 3 and 4, when a particular address, for example, address 00 . . . 00h, is selected, the input of the buffer 151 goes high, and, after a delay, the output of the third inverter 403 goes low. The delay illustrated in FIG. 3 is a total delay caused by the series of inverters, which is a sum of the individual delays caused by each inverter in any particular embodiment of the buffer 151. An output signal of the buffer 151 goes high when all three inputs signals to the AND gate 410 are high. The output signal of the buffer 151 remains high only for a period equal to the amount of the total delay caused by the series of inverters. The output signal of each buffer 151-154 of the plurality of buffers 150 is used as a control signal for each bin cell 161-164 of the bin cell circuitry 160. A power consumption of the analog line coverage circuit 104 is proportional to a length of the BUFFER OUTPUT pulse that appears at the output of each buffer when each associated address is selected. Advantageously, the length of the BUFFER OUTPUT pulse is short. In some embodiments, the length of the BUFFER OUTPUT pulse is 1-10 ns, depending on the frequency of the CLOCK signal. As a result, in one embodiment, the power consumption of the analog line coverage circuit 104 is merely 100 μM, approximately.

Figure 5:
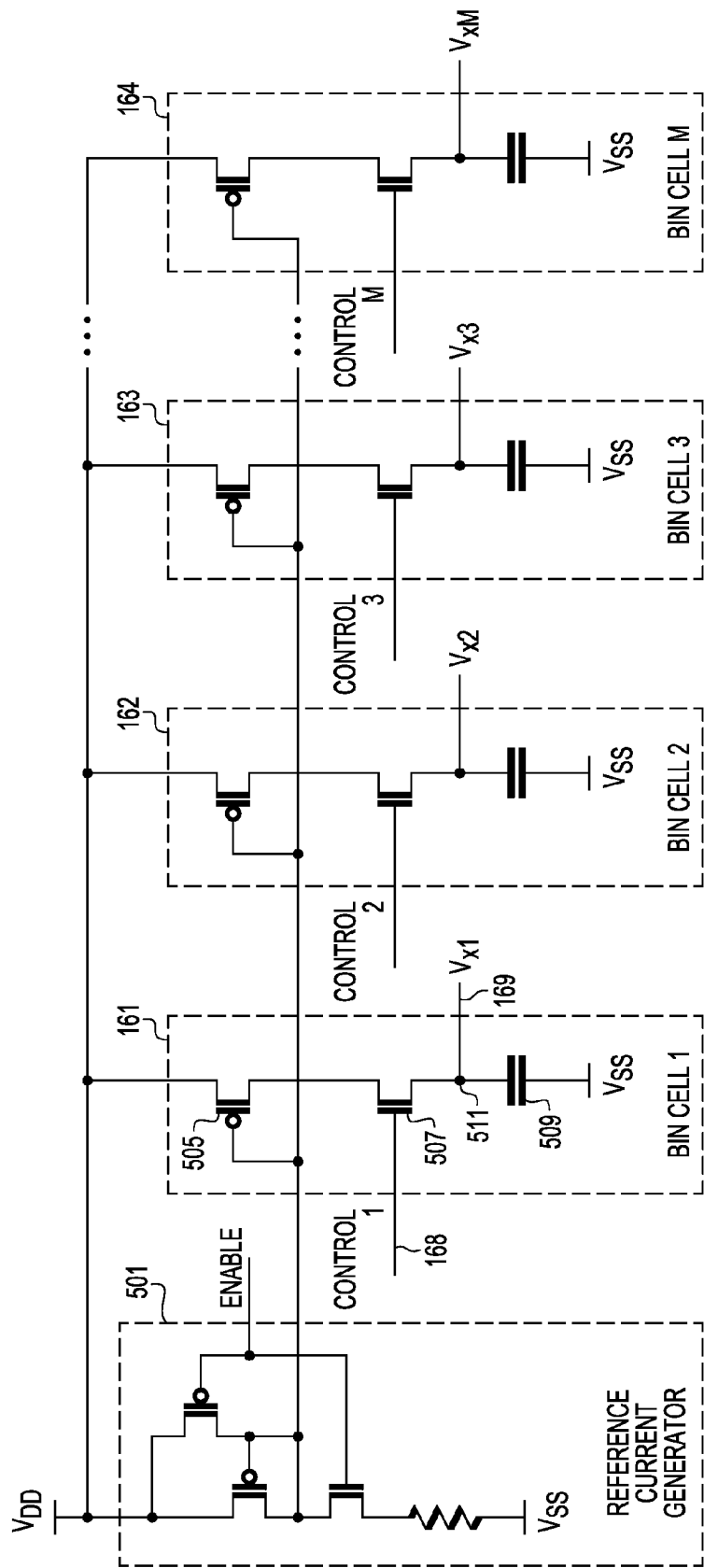
FIG. 5 is a schematic of bin cell circuitry within the analog line coverage circuit.

FIG. 5 is a schematic of one embodiment of the bin cell circuitry 160. The bin cell circuitry 160 includes a reference current generator 501 and the plurality of M bin cells 161-164. FIG. 5 illustrates a circuit design of one embodiment of the reference current generator 501. Other circuit designs for the reference current generator 501 can also be used; therefore, the circuit design illustrated in FIG. 5 for the reference current generator 501 will not be described in detail. The reference current generator provides a bias voltage for each bin cell 161-164. In one embodiment, each bin cell 161-164 is identical to the other bin cells; therefore, only one bin cell 161 will be described in detail. In one embodiment, bin cell 161 comprises a PMOS transistor 505 with its source terminal coupled to a first power supply terminal, or $V_{DD}$, with its gate terminal coupled to the reference current generator 501, and with its drain terminal coupled to a source terminal of an NMOS transistor 507. A gate terminal of NMOS transistor 507 is coupled to an output terminal of buffer 151 and receives a CONTROL1 signal on line 168 from the buffer 151. In one embodiment, the CONTROL1 signal is the BUFFER OUTPUT pulse. A drain terminal of NMOS transistor 507 is coupled to one end of a capacitor 509. Another end of the capacitor 509 is coupled to a second power supply terminal, or $V_{SS}$. In one embodiment, capacitor 509 has a value of tens to hundreds of femtofarads (typically 10-200 fF). The PMOS transistor 505 acts as a constant current source and mirrors the current produced by reference current generator 501. The NMOS transistor 507 acts as a control switch. In one embodiment, the current produced by reference current generator 501 is in the order of tens to hundreds of nanoamperes (typically 20-300 nA).

At start-up of the analog line coverage circuit 104, there is no charge on the capacitor 509. At start-up of the analog line coverage circuit 104, the magnitude of $V_{x1}$ is zero volts. During operation of the analog line coverage circuit 104, a voltage $V_{x1}$ may be produced at a node 511 between NMOS transistor 507 and capacitor 509 of bin cell "1" 161. The voltage $V_{x1}$ at node 511 is an output signal of bin cell 161, and the output signal of bin cell 161 appears on line 169. A magnitude of $V_{x1}$ is proportional to how often, or how many times, the address 131 of program memory 130 is accessed during debugging or testing of the firmware of the microcontroller 100. The CONTROL1 signal is normally low. When the CONTROL1 signal is low, NMOS transistor 507 does not conduct. On each occasion that the address 131 of program memory 130 is accessed, the CONTROL1 signal goes high for a predetermined, relatively short, period. The CONTROL1 signal goes high for a period less than the duration of the READ event of the microcontroller 100. The CONTROL1 signal goes high for a few nanoseconds (in one embodiment, 1.6 ns). During each period that the CONTROL1 signal is high, NMOS transistor 507 conducts and, as a result, capacitor 509 is charged to a certain extent. Therefore, at each occasion that the address 131 of program memory 130 is accessed, the charge on capacitor 509 increases. Consequently, after each occasion that the address 131 of program memory 130 is accessed, the magnitude of $V_{x1}$ increases by a step voltage 601 (see FIG. 6). In one embodiment, the step voltage 601 is in the order of tens of millivolts (typically 15-30 mV). The magnitude of $V_{x1}$ is an analog representation of a number of occasions that address 131 of program memory 130 has been accessed during debugging or testing of the firmware code of the microcontroller 100. If the READ event is 16 ns, the analog line coverage circuit 104 is designed so that $V_{x1}$ reaches in less than 16 ns a value that corresponds to occurrence of one READ event.

Typically, it takes in the order of tens of milliseconds, or more, before any significant leakage of charge from the capacitor 509 occurs. Typically, it takes in the order of tens of microseconds for the firmware to run. Therefore, leakage of charge from the capacitor 509 does not adversely affect operation of the analog line coverage circuit 104.

Figure 6:
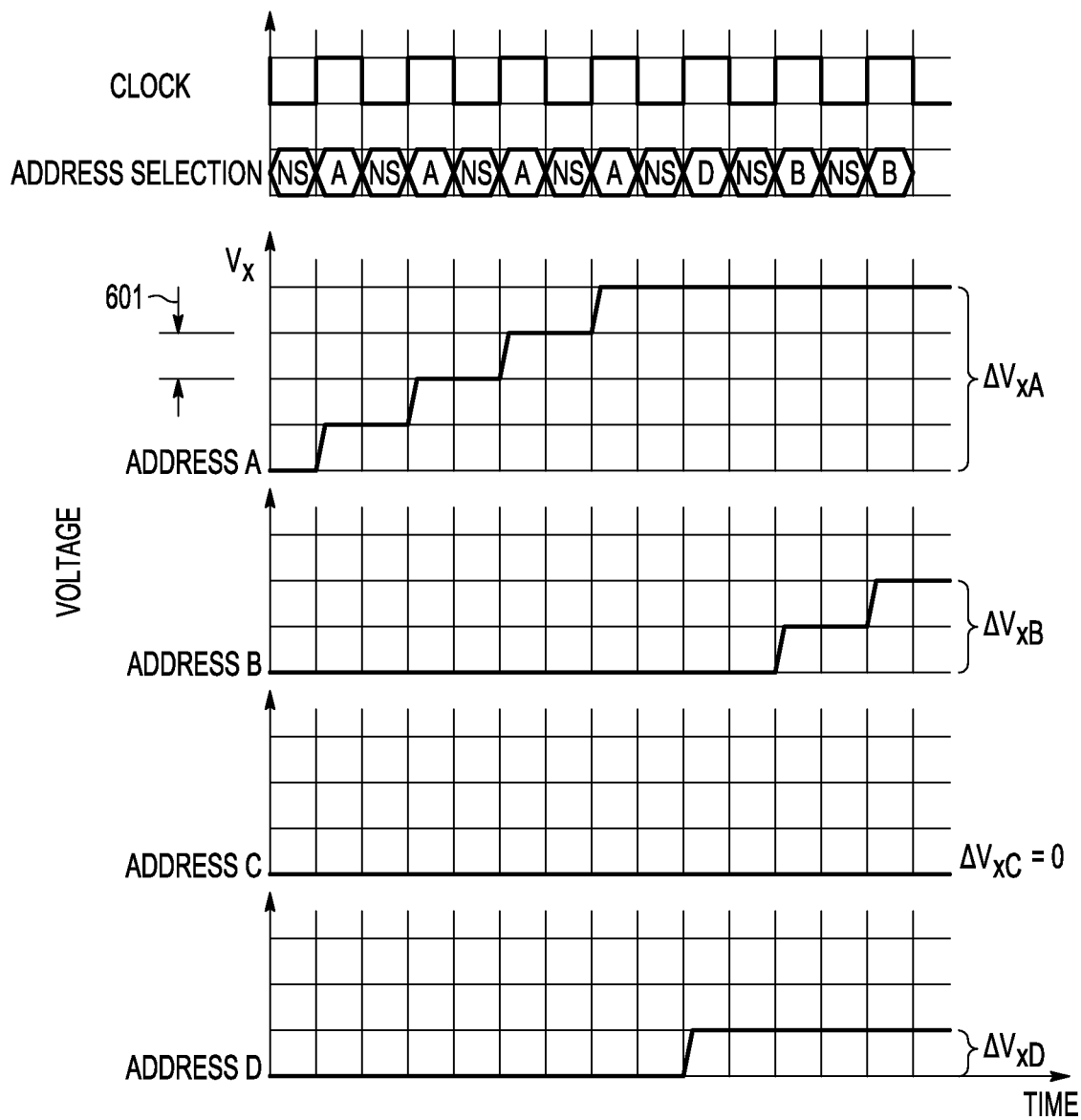
FIG. 6 is a chart of an example of output signals of four bin cells of the bin cell circuitry.

FIG. 6 is a chart of an example of output signals of four bin cells 161-164 of the bin cell circuitry 160, produced by a random test sequence, for program memory locations having addresses A, B, C and D. In FIG. 6, the abbreviation "NS" means "no selection". At every transition of the CLOCK signal, the voltage $\Delta V_x$ for a particular address may either increase or remain unchanged, depending upon whether such address was accessed during such transition. In one embodiment, at every rising edge transition of the CLOCK signal, the voltage $\Delta V_x$ for a particular address may either increase or remain unchanged, depending upon whether such address was accessed during such transition. FIG. 6 shows that address "A" is accessed a greater number of times than address "B", and that address "B" is accessed a greater number of times than address "D", and that address "C" is not accessed at all. More specifically, FIG. 6 shows that, during the first fourteen (14) clock transitions, address "A" is accessed four (4) times, address "B" is accessed two (2) times, and address "D" is accessed one (1) time. Consequently, FIG. 6 shows that $\Delta V_x$ of address "D" has a certain voltage (equal to one step voltage 601), $\Delta V_x$ of address "B" is double the voltage of address "D", and $\Delta V_x$ of address "A" is four times the voltage of address "D". FIG. 6 also shows that $\Delta V_x$ of address "C" is zero volts. Because address "C" is not accessed, this example demonstrates that the firmware code of the microcontroller 100 can be re-written so as to not use address "C".

A magnitude of the output signal ($\Delta V_x$) from the bin cells 161-164 can be set to a desired value. The magnitude of the voltage of the output signal ($\Delta V_x$) from the bin cells 161-164 is set as follows: It is assumed that $V_{DD}$ is known and set. A first step in setting the magnitude of the output signal ($\Delta V_x$) from the bin cells 161-164 is to calculate a magnitude for the step voltage 601. From design specifications, a maximum number of addresses that may be required by the firmware is determined. The magnitude of the step voltage 601 is calculated by dividing the $V_{DD}$ value by the maximum number of addresses. For example, if one thousand (1,000) steps for $V_{x1}$ are desired, and $V_{DD}$=3.3V, then the step voltage 601 is 3.3V/1000=3.3 mV. For example, if two hundred twenty (220) steps for $V_{x1}$ are desired, and $V_{DD}$=3.3V, then the step voltage 601 is 3.3V/220=15 mV. Next, a capacitance of capacitor 509 is determined. The capacitance of capacitor 509 is determined by an area that is available to implement the analog line coverage circuit 104. When $V_{DD}$=3.3V and the step voltage 601 is 15 mV, the capacitance of capacitor 509 is, in one embodiment, 20 fF. Based on the magnitude of the step voltage 601 and the capacitance of capacitor 509, an amount of reference current generated by the reference current generator 501 and a duration of the BUFFER OUTPUT pulse that charges the capacitor 509 are calculated. In such one embodiment, the reference current is approximately 190 nA and the duration of the BUFFER OUTPUT pulse is approximately 1.6 ns. Therefore, in such one embodiment, the magnitude of the output signal ($\Delta V_x$) from a bin cell, such as bin cell 161, that corresponds to occurrence of one READ event is 15 mV. See, for example, $\Delta V_{xD}$ in FIG. 6. Accordingly, in such one embodiment, the magnitude of the output signal ($\Delta V_x$) from a bin cell, such as bin cell 161, that corresponds to occurrence of two READ events is 30 mV. See, for example, $\Delta V_{xB}$ in FIG. 6. Accordingly, in such one embodiment, the magnitude of the output signal ($\Delta V_x$) from a bin cell, such as bin cell 161, that corresponds to occurrence of four READ events is 60 mV. See, for example, $\Delta V_{xA}$ in FIG. 6.

Each occasion that each address is accessed, the voltage on the capacitor 509 of the corresponding bin cell increases (by an amount equal to the step voltage 601) to a new $\Delta V_x$, as a result of the constant current from PMOS transistor 505, which is a mirror of the constant current of the reference current generator 501. The analog voltage $\Delta V_x$ is then converted to a sequence of bits by the A/D converter 180. Advantageously, the A/D converter 180 does not need to have high resolution because, oftentimes, a goal of line coverage testing is to determine a relative relationship with regard to frequency of access among the word lines of the program memory 130 and/or to determine which word line(s), if any, of the program memory are not accessed at all. However, in another embodiment, the A/D converter 180 is a high resolution A/D converter and the analog line coverage circuit 103 determines an exact number of times, if any, that each word line of the program memory 130 is accessed.

The leakage current from the capacitor 509 may be used to reset the analog line coverage circuit 104 between usages. Because the amount of charge injected on each capacitor 509 during the debug mode is small, its leakage current can discharge it completely in few seconds. It is not necessary that the analog line coverage circuit 104 be used many times per second. Rather, the analog line coverage circuit 104 is typically used only sparingly while a user is debugging code. Therefore, after a first use, the analog line coverage circuit 104 can be disabled and the leakage current of capacitor 509 naturally resets its voltage to near zero, thereby making the analog line coverage circuit available to be enabled and used again a few seconds after it was previously used.

The analog line coverage circuit 104 can be used as follows. Step one: The microcontroller 100 is put into debug mode and the multiplexer 170 is activated. Step two: The firmware is run in debug mode and the voltage at node 511 of each bin cell 161-164 attains a value. The voltage at node 511 of certain of the bin cells 161-164 may increase while the firmware is running. Step three: While the firmware is running in debug mode, the multiplexer 170 sequentially switches whatever voltage may be present at such time at node 511 of each bin cell 161-164 to the A/D converter 180, but a user ignores the output (at pin 110) because the results may be incomplete. Step four: Immediately after the firmware has completely finished running (and the microcontroller 100 remains in debug mode), the multiplexer 170 sequentially switches a final voltage at node 511 of each bin cell to the A/D converter 180. At this juncture, the results are complete and the user may study the results that are outputted at pin 110 in digital form. The rate that the multiplexer 170 sequentially switches the voltage at node 511 of each bin cell to the A/D converter 180 may be related to the frequency of the CLOCK signal of the microcontroller 100 or may be independent of the frequency of the CLOCK signal of the microcontroller. However, the rate that the multiplexer 170 sequentially switches the voltage at node 511 of each bin cell to the A/D converter 180 is fast enough so that the voltage at node 511 of all the bin cells of the bin cell circuitry 160 is switched to the A/D converter 180 prior to any significant reduction in such voltage due to leakage current from the capacitor 509.

The analog line coverage circuit 104 can be used during a final development phase of firmware of the microcontroller 100, and the analog line coverage circuit can reduce the cost of such final development phase.

The analog line coverage circuit 104 provides, to a user, statistics pertaining to memory usage that is easily verifiable so that memory usage can be optimized.

In one embodiment, a circuit comprises the memory 130 that includes the plurality of memory locations 131-134, and the analog line coverage circuit 104, which is coupled to the memory. The analog line coverage circuit 104 includes the plurality of bin cells 161-164. Each bin cell 161-164 corresponds to a memory location 131-134. Each bin cell 161-164 provides, at an output terminal thereof (see, for example, line 169), a signal $V_{x1}$-$V_{xM}$ representative of the number of times that a respective memory location is accessed 131-134.

In one embodiment, a method comprises the steps of accessing the memory location 131, storing charge in the capacitor 509 in response to accessing the memory location 131, and realizing the voltage $V_{x1}$ related to charge stored in the capacitor. A value of the voltage $V_{x1}$ is indicative of the number of occasions that the memory location 131 is accessed.

In one embodiment, an integrated circuit 101 comprises the memory 130 that includes the memory location 131, and the analog line coverage circuit 104 which is coupled to the memory. The analog line coverage circuit 104 produces the analog voltage $V_{x1}$ that is indicative of the number of occasions that the memory location is accessed.

Although the invention is described herein with reference to specific embodiments, various modifications and changes can be made without departing from the scope of the present invention as set forth in the claims below. For instance, although the description of one exemplary embodiment of the analog line coverage circuit 104 states that it is disposed on an integrated circuit, the invention is equally usable when constructed entirely of components consisting of discrete devices.

Although, in one exemplary embodiment, the analog line coverage circuit 104 is disposed on an integrated circuit fabricated using CMOS technology, the analog line coverage circuit can also be disposed on an integrated circuit fabricated using other technologies. Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe.

Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A circuit, comprising:
   a memory including a plurality of memory locations; and
   an analog line coverage circuit, coupled to the memory, the analog line coverage circuit including a plurality of bin cells, each bin cell corresponding to a memory location, each bin cell providing, at an output terminal thereof, a signal representative of a number of times that a respective memory location is accessed.

2. The circuit of claim 1, in which each memory location is a word line.

3. The circuit of claim 1, in which each memory location outputs a signal when such memory location is accessed.

4. The circuit of claim 1, including a plurality of buffers, each buffer coupled between a memory location and a bin cell, and in which, in response to such signal, each buffer outputs a buffer signal to a bin cell.

5. The circuit of claim 1, in which each bin cell stores an analog voltage that is representative of a number of times that a memory location of memory is accessed.

6. The circuit of claim 5, in which each bin cell includes a capacitor that stores a charge representative of a number of times that the memory location to which the bin cell is coupled is accessed.

7. The circuit of claim 1, further comprising:
   a processor coupled to the memory;
   a multiplexer including a plurality of input terminals and an output terminal, each input terminal coupled to a bin cell; and
   an analog-to-digital (A/D) converter including an input terminal coupled to the output terminal of the multiplexer and including an output terminal, wherein the multiplexer sequentially switches the analog voltage stored in each bin cell to the A/D converter, and in which the A/D converter outputs digital signals that are at least proportional to the number of times that each memory location of memory is accessed by the processor.

8. The circuit of claim 7, including a plurality of buffers, each buffer coupled between a memory location and a bin cell, in which the signal outputted by the memory when a memory location is accessed has a duration of a READ event of the processor and, in response to such signal, each buffer outputs a buffer signal to a bin cell, in which a duration of the buffer signal is shorter than the duration of the signal outputted by the memory.

9. The circuit of claim 8, in which the A/D converter outputs digital signals that represent a number of times that each memory location of memory is accessed by the processor.

10. The circuit of claim 1, including a reference current generator for generating a reference current, in which the reference current generator is coupled to each bin cell, and in which each bin cell includes:
    a capacitor with one end coupled to a power supply terminal, and having another end;
    a first transistor with its control electrode coupled to an output terminal of a buffer and with one conducting electrode coupled to the other end of capacitor, and having another conducting electrode; and
    a second transistor with one conducting electrode coupled to another power supply terminal, with its control electrode coupled to the reference current generator, and with another conducting electrode coupled to a conducting electrode of the first transistor, wherein the second transistor acts as a constant current source that mirrors the reference current.

11. The circuit of claim 10, in which a voltage is produced at a node between the first transistor and the capacitor, and in which a magnitude of the voltage is representative of a number of times that a memory location is accessed.

12. An integrated circuit, comprising:
    a memory, the memory including a memory location; and
    an analog line coverage circuit coupled to the memory, wherein the analog line coverage circuit produces an analog voltage that is indicative of a number of occasions that the memory location is accessed.

13. The integrated circuit of claim 12, wherein the analog line coverage circuit includes a bin cell including a capacitor, wherein the analog line coverage circuit charges the capacitor for a predetermined period each occasion that the memory location is accessed, and wherein the analog voltage produced by the analog line coverage circuit is related to the charge on the capacitor.

14. The integrated circuit of claim 13, in which the memory includes a plurality of memory locations and in which the analog line coverage circuit includes a same plurality of bin cells, wherein each bin cell is coupled to an associated memory location and produces an analog voltage that is indicative of a number of occasions that the associated memory location is accessed.

15. The integrated circuit of claim 14, including a buffer coupled between a memory location and a bin cell, in which the memory location outputs a signal to the buffer when the memory location is accessed, and, in response to such signal, the buffer outputs a buffer signal to the bin cell for controlling the bin cell.

16. The integrated circuit of claim 15, in which the signal that the memory location outputs has a first duration and the signal that the buffer outputs has a second duration, wherein the second duration is shorter than the first duration.

17. The integrated circuit of claim 15, in which each bin cell comprises:
   a capacitor with one end coupled to a power supply terminal, and having another end;
   a first transistor with its gate terminal coupled to an output terminal of a buffer and with its drain terminal coupled to the other end of capacitor, and having a source terminal, wherein the first transistor conducts in response to the buffer signal, and wherein the capacitor charges to a higher voltage each occasion that the first transistor conducts, a magnitude of the voltage being indicative of a number of occasions that a memory location of memory is accessed; and
   a second transistor with its source terminal coupled to another power supply terminal, and with its drain terminal coupled to the source terminal of the first transistor, wherein the second transistor supplies a constant current to the first transistor.

18. The integrated circuit of claim 15, further comprising:
a processor coupled to the memory;
a multiplexer including a plurality of input terminals and an output terminal, each input terminal coupled to a bin cell; and
an analog-to-digital (A/D) converter including an input terminal coupled to the output terminal of the multiplexer and including an output terminal, wherein multiplexer that sequentially switches the analog voltage stored in each bin cell to the A/D converter, and in which the A/D converter outputs digital signals that are at least proportional to the number of times that each memory location of memory is accessed by the processor.

* * * * *